United States Patent [19]

Batt et al.

[11] Patent Number: 4,640,980

[45] Date of Patent: Feb. 3, 1987

[54] ELECTRO-MAGNETIC SCREENING DEVICE FOR ELECTRICAL CABLING CONSTITUTING BUNDLES OF CABLES COMPRISING TAPPINGS

[75] Inventors: André Batt, Le Mesnil Saint Denis; Jacques, J. A. Delabie, Bonneuil sur Marne, both of France

[73] Assignee: Societe Nationale d'Etude et de Construction de Meteur d'Aviation S.N.E.C.M.A., Paris, France

[21] Appl. No.: 737,492

[22] Filed: May 24, 1985

[30] Foreign Application Priority Data

Jun. 14, 1984 [FR] France ................................ 84 09285

[51] Int. Cl.$^4$ ........................... H02G 3/00; H01B 7/34
[52] U.S. Cl. .................................... 174/36; 174/72 R; 285/420
[58] Field of Search ....................... 174/36, 71 r, 72 R, 174/74 A; 285/137 R, 260, 255, 420

[56] References Cited

U.S. PATENT DOCUMENTS

| | | | |
|---|---|---|---|
| 3,151,211 | 9/1964 | Reid et al. .......................... | 174/72 R |
| 3,336,056 | 8/1967 | Cassel et al. . | |
| 4,015,961 | 4/1977 | Howard et al. ................. | 285/260 X |
| 4,032,176 | 6/1977 | Tabary ............................. | 285/260 X |
| 4,085,284 | 4/1978 | Olszewski et al. .................... | 174/36 |

FOREIGN PATENT DOCUMENTS 29943 11/1967 Australia .
2823949 12/1979 Fed. Rep. of Germany .

OTHER PUBLICATIONS

J. E. Acord: "Connector for Electro-Magnetic Shielding" Navy Technical Disclosure Bulletin No. 64280 2414 Navy Technical Disclosure Bulletin, vol. 5, No. 6, Jun. 1980.

Primary Examiner—Arthur T. Grimley
Assistant Examiner—Morris H. Nimmo
Attorney, Agent, or Firm—Oblon, Fisher, Spivak, McClelland & Maier

[57] ABSTRACT

An assembly of electro-magnetic screening devices for electrical cabling including tappings or branches of the kind in which each main cable and each tapping is enclosed in a screening sheath. At the junction between the main cable and the tappings each tapping is surrounded by a metallic ring itself covered by the screening sheath, the various metallic rings of the various tappings at one point being juxtaposed and the assembly thus formed being externally covered successively by the screening sheath of the main cable and by an external metallic ring which clamps the assembly.

5 Claims, 5 Drawing Figures

ELECTRO-MAGNETIC SCREENING DEVICE FOR ELECTRICAL CABLING CONSTITUTING BUNDLES OF CABLES COMPRISING TAPPINGS

BACKGROUND OF THE INVENTION

1. Field of the Invention

This invention relates to an assembly of electro-magnetic screening devices.

2. Summary of the Prior Art

Numerous electrical or electronic installations comprise bundles of cables which must be protected from disturbing electro-magnetic radiation. To this end, these bundles of cables comprise an external sheath, generally constituted by metallic braiding forming a Faraday cage, serving as high frequency screening. When such bundles comprise tappings it is important that there should be no crack of the screening in the zone of the junction of the tapping with the main bundle. This problem is particularly acute whenever it is important that the various low level signals must not be subjected to any disturbance due to electro-magnetic radiations having a very wide range of frequencies and from various sources. In the same manner, these cable bundles may carry voltages which may be a source of disturbances from which it is important to preserve their environment. As a consequence, the requirements for the material are more and more severe and in numerous instances it is necessary to minimize the presence of defects in the screening of the cable bundles, particularly at the junctions with branches or tappings. Such a requirement was rarely satisfied in the prior art although it was generally customary to interconnect electrically the metallic sheaths of the main cable and of the tapping, by forming a type of enrobing at the junction itself. It has also been contemplated to make braided metallic sheaths in a complex way in order to match the tapping perfectly, but this solution is very costly and inflexible in use. Furthermore, such arrangements give rise to the disadvantage of mechanical fragility, as a result of which it is readily possible to create openings in the screening. Even small openings may quickly be the cause of substantial disturbances under the action of high frequency electro-magnetic waves.

SUMMARY OF THE INVENTION

According to the present invention there is provided an assembly of electro-magnetic screening devices comprising a first cable, a second cable, a third cable, said cables being interconnected at a junction, a first metallic braided screening sheath enclosing the first cable, a second metallic braided screening sheath enclosing the second cable, a third metallic braided screening sheath enclosing the third cable, and metal rings associated with each cable and the corresponding sheath at said junction, the metal ring of the first cable enclosing the remaining rings and end portions of the sheaths and serving to clamp the assembly together.

In accordance with one preferred embodiment, each metallic ring which surrounds a tapping is placed around the metallic screening sheath of the tapping and is externally covered by a return-fold of said sheath.

Advantageously, the metallic rings which surround the tappings have complementary profiles which reproduce, after juxtaposition, an external profile similar to that of the main cable and that of the inter-connection of the assembly is ensured by tapping of the external metallic ring or by any other clamping means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 illustrates, in cross-section, a third combination of metallic rings.

DESCRIPTION OF THE PREFERRED EMBODIMENTS

Figure 1:
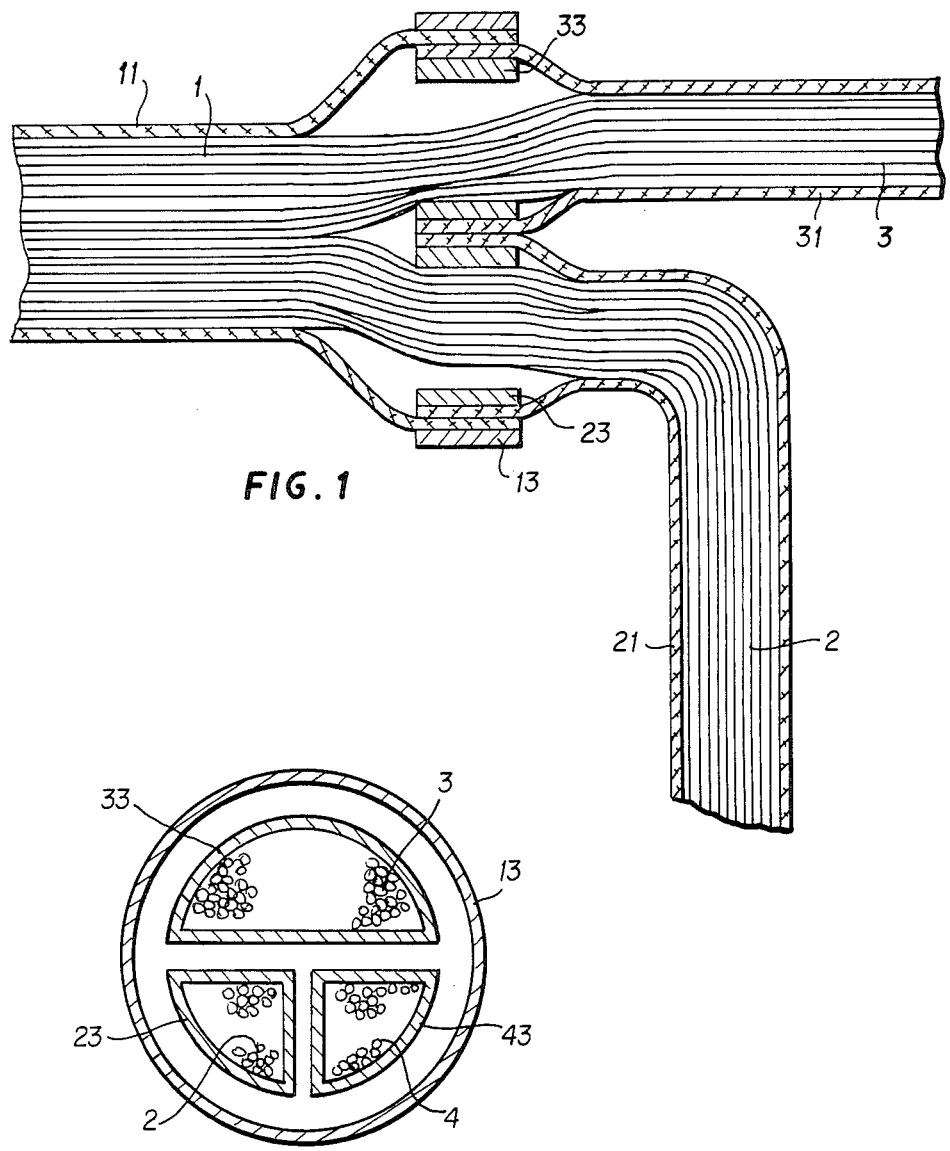
FIG. 1 illustrates, in longitudinal section, one assembly of electro-magnetic screening devices in accordance with a first embodiment of the invention.

As has been illustrated in FIG. 1, a main bundle 1 of electric cables divided into two secondary bundles 2 and 3. Each bundle of cables is built up, from the inside to the outside, of the cables themselves, and a metallic braided screening sheath, respectively 11,21 and 31 is applied externally. The assembly of devices specifically aims to achieve perfect continuity of the electro-magnetic screening provided by the sheaths 11,21 and 31. To this end, an end portion of the bundle 2 of cables is surrounded by a metallic ring 23 of which the internal section corresponds to the external section of the bundle 2 and which is externally covered by the sheath 21. An end portion of the bundle 3 carries a metallic ring 33 and the bundle is externally covered by the metallic sheath 31.

The rings 23 and 33 are juxtaposed and the assembly thus formed is externally covered successively by an end portion of the metallic screening sheath 11 of the bundle 1 and by a metallic ring 13 serving to ensure locking of the assembly, preferably by clamping.

Figure 2:
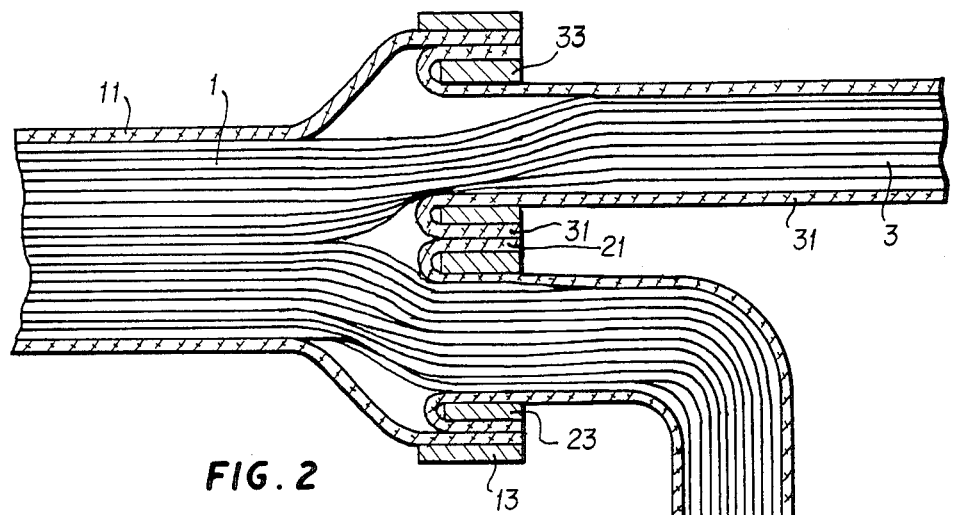
FIG. 2 illustrates, in longitudinal section, a preferred embodiment of an assembly of electro-magnetic screening devices in accordance with a second embodiment of the invention.

In the preferred embodiment illustrated in FIG. 2, the metallic ring 23 is externally covered by a return fold of the metallic sheath 21. Similarly, the metallic ring 33 is externally covered by a return fold of the metallic sheath 31. This arrangement, which leads to a cross-sectional bulk slightly greater than that of the preceding embodiment, has, however, mechanical qualities, particularly under tension, which are improved.

Figure 3:
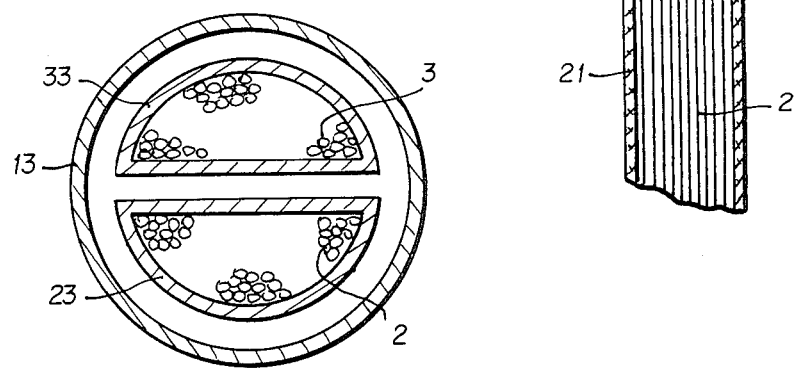
FIG. 3 illustrates, in cross section, metallic rings used in carrying out a third embodiment of the invention.
Figure 4:
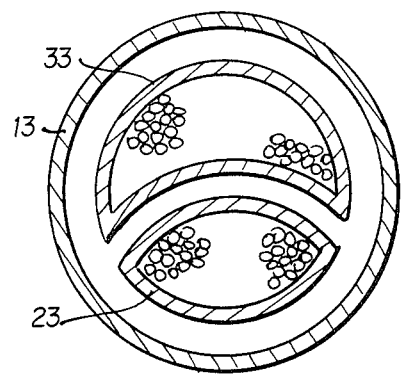
FIG. 4 illustrates, in cross-section, a second combination of metallic rings.

As the three examples illustrated in FIGS. 3, 4 and 5, the metallic rings 23,33 and 43 preferably have complementary profiles which reproduce, after juxtaposition, an external profile similar to that of the main bundle for enclosing the second, third and a fourth bundle of cables. The shapes to be adopted for the rings depend upon the sections and the orientations of the bundles. FIGS. 3–5 are only possible examples of shapes of rings that can be mounted according to the structure shown in FIG. 1 or 2. FIG. 5 shows a secondary bundle 4 identical with bundle 2 represented in FIGS. 1 and 2.

Besides providing excellent electro-magnetic screening properties, the devices in accordance with the invention have a good mechanical strength in traction, with reduced bulk in comparison with known devices. Furthermore, the devices enable relative displacement of the cables within the bundles, and facilitate repair.

What is claimed is:

1. An assembly of electro-magnetic screening devices, comprising:
   a first cable,
   a second cable,
   a third cable, said first, second and third cables being interconnected at a junction,
   a first metallic braided screening sheath enclosing the first cable,
   a second metallic braided screening sheath enclosing the second cable,
   a third metallic braided screening sheath enclosing the third cable, and
   metal rings respectively surrounding each of said cables and a corresponding sheath of said first, second and third sheaths at said junction, the metal ring of the first cable enclosing the remaining rings and end portions of the sheaths and serving to clamp the assembly together.

2. An assembly of devices according to claim 1, wherein each ring associated with the second and third sheath lies within a return fold of each respective sheath.

3. An assembly of devices according to claim 1, wherein the rings of the second and third cables have profiles such that together they nest within the profile of the first cable and the first sheath.

4. An assembly of devices according to claim 2, wherein the rings of the second and third cables have profiles such that together they nest within the profile of the first cable and the first sheath.

5. An assembly of electromagnetic screening devices, comprising:
   a first cable,
   a second cable,
   a third cable, said first, second and third cables being interconnected at a junction,
   a first metallic braided screening sheath enclosing the first cable,
   a second metallic braided screening sheath enclosing the second cable, having an end portion in the form of a return fold,
   a third metallic braided screening sheath enclosing the third cable having an end portion in the form of a return fold,
   a first closed ring of semi-annular form engaged with the return fold of the second sheath
   a second closed ring of semi-annular form engaged with the return fold of the third sheath; and
   a clamping ring of annular form surrounding an end portion of the first sheath and serving to clamp the entire assembly.

* * * * *